United States Patent
Atwood

(10) Patent No.: US 11,079,406 B2
(45) Date of Patent: Aug. 3, 2021

(54) SEMICONDUCTOR MICRO PROBE ARRAY HAVING COMPLIANCE

(71) Applicant: International Business Machines Corporation, Armonk, NY (US)

(72) Inventor: Eugene R. Atwood, Housatonic, MA (US)

(73) Assignee: International Business Machines Corporation, Armonk, NY (US)

( * ) Notice: Subject to any disclaimer, the term of this patent is extended or adjusted under 35 U.S.C. 154(b) by 600 days.

(21) Appl. No.: 15/252,301

(22) Filed: Aug. 31, 2016

(65) Prior Publication Data

US 2018/0059138 A1    Mar. 1, 2018

(51) Int. Cl.
- *G01R 1/067* (2006.01)
- *G01R 1/073* (2006.01)
- *G01R 31/28* (2006.01)

(52) U.S. Cl.
CPC ....... *G01R 1/06716* (2013.01); *G01R 1/0735* (2013.01); *G01R 1/07378* (2013.01); *G01R 31/2889* (2013.01)

(58) Field of Classification Search
CPC ............ G01R 31/2886; G01R 31/2887; G01R 31/2891; G01R 31/2889; G01R 31/2893; G01R 1/06716; G01R 1/07364; G01R 1/07371; G01R 1/07378; G01R 1/07314; G01R 1/0735

See application file for complete search history.

(56) References Cited

U.S. PATENT DOCUMENTS

| | | |
|---|---|---|
| 4,780,086 A | 10/1988 | Jenner et al. |
| 5,385,477 A | 1/1995 | Vaynkof et al. |
| 6,310,484 B1 | 10/2001 | Akram et al. |
| 6,900,652 B2 | 5/2005 | Mazur |
| 7,195,503 B2 | 3/2007 | Eldridge |
| 7,250,780 B2 | 7/2007 | Hembree et al. |
| 7,349,223 B2 | 3/2008 | Haemer et al. |
| 7,388,388 B2 | 6/2008 | Dong |
| 7,595,653 B2 * | 9/2009 | Henttonen .............. G01L 27/00 324/750.01 |
| 7,629,804 B2 | 12/2009 | Nguyen et al. |
| 7,649,145 B2 | 1/2010 | Kirby et al. |

(Continued)

OTHER PUBLICATIONS

Kataoka K. et al., "Multi-Layer Electroplated Micro-Spring Array for MEMS Probe Card", Micro Electro Mechanical Systems, 17th IEEE International Conference on (MEMS), pp. 733-736 (2004).

(Continued)

*Primary Examiner* — Son T Le
*Assistant Examiner* — Dustin R Dickinson
(74) *Attorney, Agent, or Firm* — Scully, Scott, Murphy & Presser, P.C.; L. Jeffrey Kelly, Esq.

(57) ABSTRACT

A die probe including a probe tip operably connected to a first surface of a thin film; a metal trace, wherein a first portion of the metal trace is operably connected to a second surface of the thin film, the second surface of the thin film opposite the first surface of the thin film; and an upper space transformer, wherein a second portion of the metal trace is operably connected to the upper space transformer, wherein a pressurized liquid and/or gas is configured to expand a space between the second surface of the thin film and the upper space transformer.

15 Claims, 17 Drawing Sheets

(56) References Cited

U.S. PATENT DOCUMENTS

| | | |
|---|---|---|
| 7,967,621 B2 | 6/2011 | Eldridge |
| 8,004,296 B2 | 8/2011 | Di Stefano et al. |
| 2002/0055282 A1* | 5/2002 | Eldridge .............. G01R 1/0483 439/66 |
| 2003/0099097 A1* | 5/2003 | Mok .................... H05K 7/1061 361/767 |
| 2004/0012403 A1* | 1/2004 | Richmond, II .... G01R 31/2863 324/750.3 |
| 2005/0026476 A1* | 2/2005 | Mok ....................... C23C 18/00 439/81 |
| 2011/0074455 A1* | 3/2011 | Nakata .................... G01R 1/07 324/754.03 |
| 2011/0266539 A1* | 11/2011 | Chey ................. G01R 1/06716 257/48 |
| 2011/0316576 A1* | 12/2011 | Kataoka ............. G01R 1/07378 324/756.03 |
| 2012/0068728 A1* | 3/2012 | Kataoka ............. G01R 31/2887 324/756.03 |
| 2014/0029150 A1* | 1/2014 | Fledell .................... H02H 9/02 361/93.9 |

OTHER PUBLICATIONS

Zimmermann K.F., "SiProbe—A New Technology for Wafer Probing", Proceedings of the IEEE International Test Conference on Driving Down the Cost of Test, pp. 106-112 (1995).

* cited by examiner

SEMICONDUCTOR MICRO PROBE ARRAY HAVING COMPLIANCE

BACKGROUND

The present application relates to die probe technology, and more particularly to a die probe that includes a region configured to expand upon acceptance of a pressurized liquid and/or gas.

Fine probe technologies such as Thin Film Interface (TFI) probes or Probe on Substrate (POS) probes rely on deformation of the contacted structure to supply compliance between an individual probe, the probed object and other probes and probe objects in the array. However, the amount of compliance is very small and is due to the individual small strains (cumulatively large) induced in the probes and probed objects.

Often the probed objects may be formed of materials with low yield points where deformation is inelastic. The following three issues may occur in typical electrical micro probing systems.

1. Non planarity of the probe array and of the array of Objects to be probed. To overcome the non-planarity the probe must "over" travel, which results in needing significant force to completely effect a reliable electrical contact across all probes of the array. The force on the probe array acting on the probed objects results in significant pressure in the area under some probed objects, an area deformation of the probed objects (usually making the probed array of micro solder balls more planar with respect to the array of micro probes by being squashed) and the deformation of the probe structure itself. The associated reaction force of the array strains the probe substrate causing elastic deformation of the probe substrate.

2. The need for initial planarization methods such as wafer probe-to-die hardware planarization adjustment methods or complex gimbaling probe hardware. For both situations wedge planarity is compensated to some degree. Depending on the accuracy in the wafer-to-die prober case and gimbal final XY plane rotation (not theta), non-uniform probe pressures exist across the probe array/die contacts. Non wedge planarities are not compensated unless the die camber (bow) matches the final deformation of the probe substrate. Observation of the amount of stress relaxation of the probed bumps usually shows uneven "squashing" across the array of contacted bumps.

3. Contact reliability in low compliance systems has two components: minimal scrubbing action exists and controlled pressure between the probe and the probed object. Scrubbing breaks through insulating films to effect a good electrical contact between the robe and the probed object. In wafer probe systems, which utilize "Z" axis travel, the typical process "over" travels in the "Z" axis by some learned amount that results in the best site-to-site repeatability.

Other probing systems use some form of spring to provide scrubbing and compliance, such as cantilever needle probes, micro spring probes or buckling beam probes. In the first case, it is impractical to form large arrays of this type of probe, and in the second and third case, the relatively long length of the probe "wire" has significantly greater power supply inductance compared to the Thin Film Interface (TFI) or Probe On Substrate (POS) probe.

Thus, a probe that addresses the above issues and others is desired. What is also desired is individual probe compliance being substantially equivalent probe forces, minimizing probe inductance, enabling low contact resistance, conformal compliance to warp, wedge and camber. What is also desired is a method to address the decoupling coefficient of thermal (CTE) expansion (X Y axis in plane of die under test or use) mismatches in both probe and electronic package systems.

SUMMARY

In one embodiment, a die probe is provided. The die probe includes a probe tip operably connected to first surface of a thin film; a metal trace, wherein a first portion of the metal trace is operably connected to a second surface of the thin film, the second surface of the thin film opposite the first surface of the thin film; and an upper space transformer, wherein a second portion of the metal trace is operably connected to the upper space transformer, wherein a pressurized liquid and/or gas is configured to expand a space between the second surface of the thin film and the upper space transformer.

In another aspect of the present application a die probe is provided. The die probe includes a probe tip operably connected to a first surface of a first thin film; a metal trace, wherein a first portion of the metal trace is operably connected to a second surface of the first thin film, the second surface of the first thin film being opposite the first surface of the first thin film; a second thin film, wherein a second portion of the metal trace is operably connected to a first surface of the second thin film; and an underfill, wherein the underfill is operably connected to a second surface of the second thin film, the second surface of the second thin film being opposite the first surface of the second thin film, wherein a pressurized liquid and/or gas is configured to expand a space between the second surface of the first thin film and the first surface of the second thin film.

In another aspect of the present application a die is provided. The die includes a solder ball operably connected to a first surface of a lower space transformer; a metal trace, a first portion of the metal trace operably connected to a second surface of the lower space transformer, the second surface of the lower space transformer being opposite the first surface of the lower space transformer; and an upper space transformer, a second portion of the metal trace operably connected to the upper space transformer, wherein a pressurized liquid and/or gas is configured to expand a space between the upper space transformer and the second surface of the lower space transformer.

DETAILED DESCRIPTION

Figure 1:
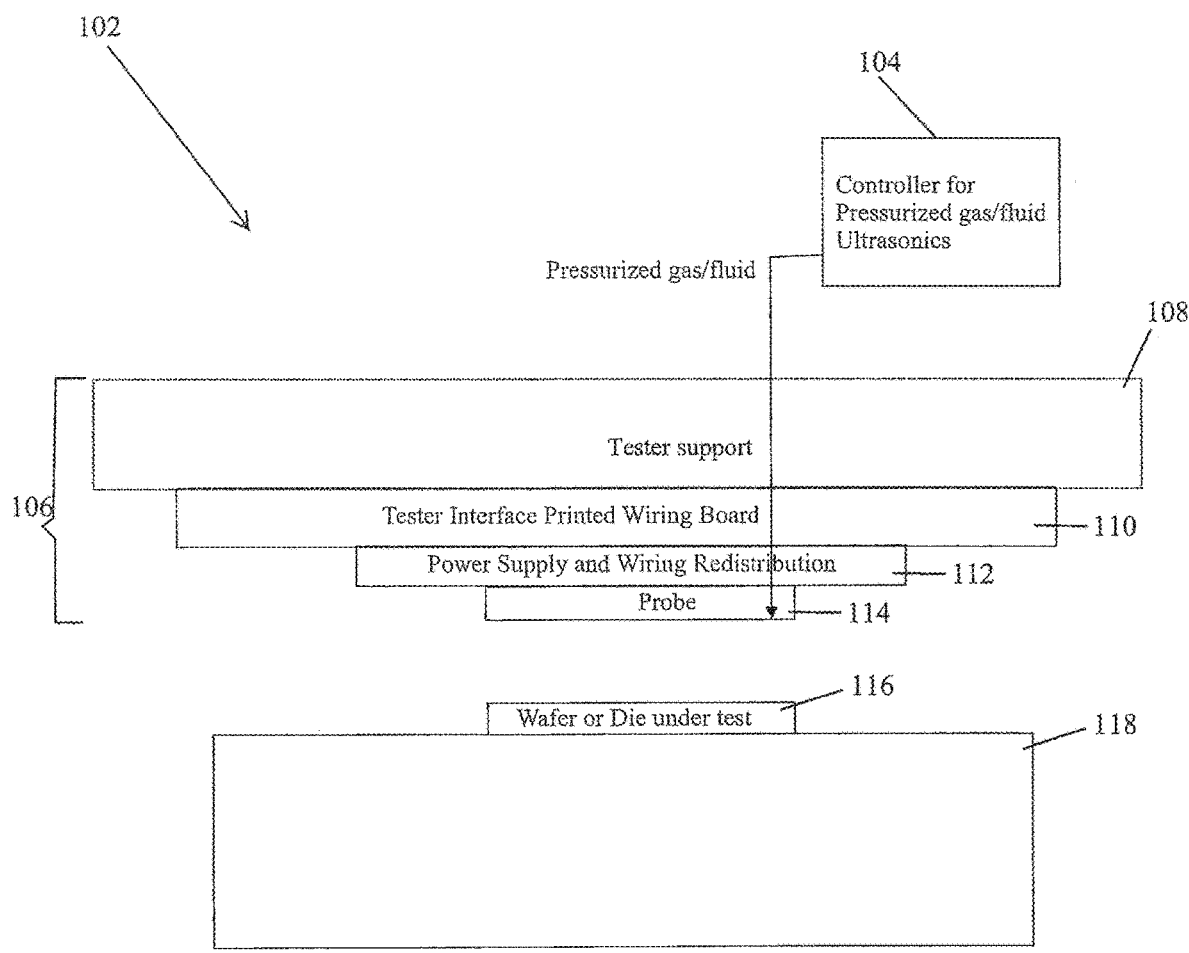
FIG. 1 is a general view of one embodiment of a probe system.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

In the discussion and claims herein, the term "about" indicates that the value listed may be somewhat altered, as long as the alteration does not result in nonconformance of the process or structure to the illustrated embodiment. For example, for some elements the term "about" can refer to a variation of ±0.1%, for other elements, the term "about" can refer to a variation of ±1% or ±10%, or any point therein.

As used herein, the term "substantially", or "substantial", is equally applicable when used in a negative connotation to refer to the complete or near complete lack of an action, characteristic, property, state, structure, item, or result. For example, a surface that is "substantially" flat would either completely flat, or so nearly flat that the effect would be the same as if it were completely flat.

Referring first to FIG. 1, there is illustrated a general view of one embodiment of a probe system 102. The probe system 102 includes a controller 104, which is configured to deliver a pressurized gas and/or fluid to a tester portion 106. Test portion 106 includes a tester support 108, a tester interface printed wiring board 110, a power supply and wiring redistribution portion 112 and a probe 114.

In this and the other embodiments of the present application, the probes are configured to test an area array of microbumps or pillars, allowing for variation in the objects being tested. Also, in this and other embodiments, the introduction of a pressurized liquid and/or gas allows for a force exerted by each probe to be substantially equal.

The probe 114, which is more fully disclosed below, is configured to contact a wafer or die 116 that is undergoing a test. The wafer or die 116 that is undergoing a test rests on, or is secured to, base 118. Base 118 can aid in probe alignment and/or thermal control during a test.

Figure 2:
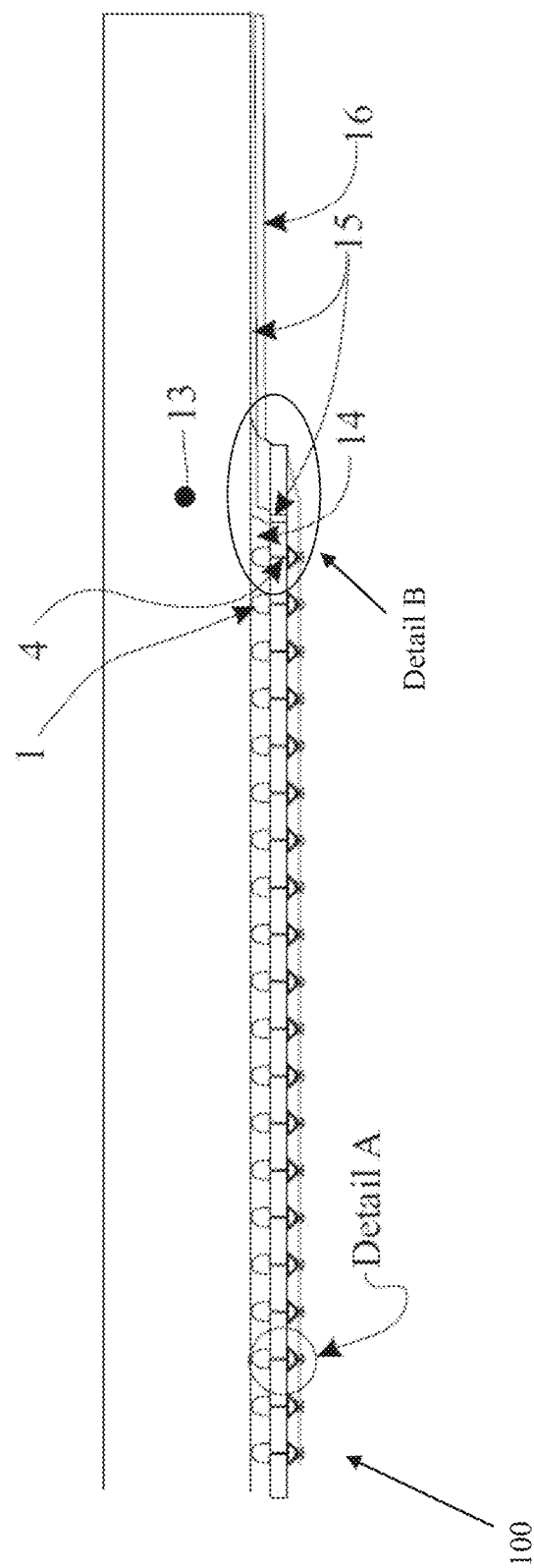
FIG. 2 is a cross sectional view of a die probe of the first embodiment.

FIG. 2 is a more detailed, cross sectional view of a die probe 100, which is an array of individual probes. As can be seen in FIG. 2, a number of individual probes include a C4 bump 1, a silicon through via 4, a space transformer 13, an underfill 14, a gas and/or fluid inlet 15 and an overmold 16. There is a circled region of FIG. 2 noted as "Detail A", which shows one individual probe in more detail and is illustrated in FIG. 3.

Figure 3:
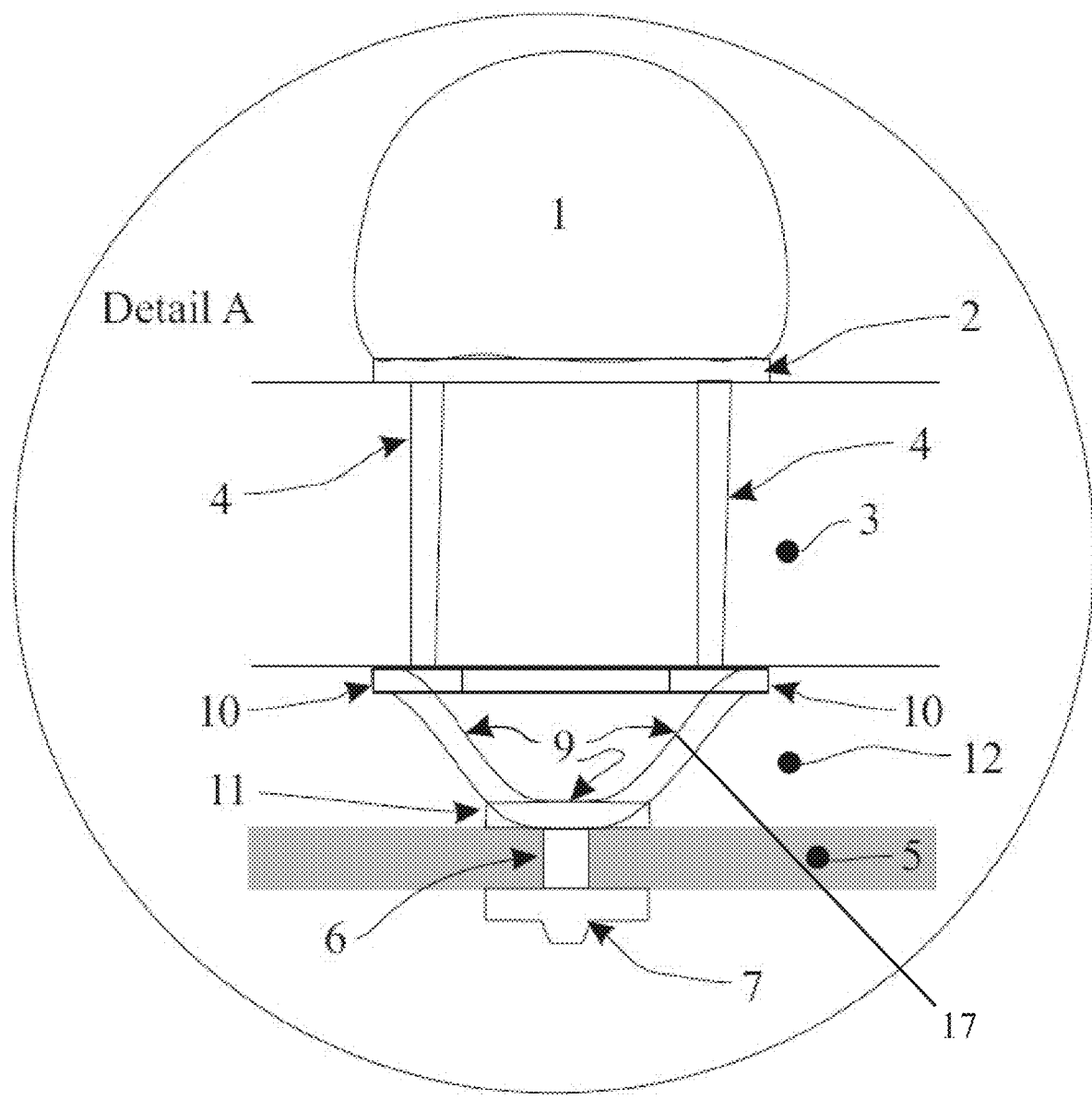
FIG. 3 is a magnified view of a portion of FIG. 2.

FIG. 3 is a magnified view of the circled region of FIG. 2 and illustrates, in a cross sectional view, the C4 bump 1, a C4 capture pad 2, an area of silicon (upper space transformer) 3, two silicon through vias 4, a thin film 5, a thin film through via 6, a probe (or probe tip) 7, a metal trace and release mask surface 9 on a metallization 17, a silicon through via land 10, a thin film land 11, a pressurized gas region 12 (that is configured to accept a pressurized gas and/or liquid). Probe 7 can be any suitable probe formed by any suitable method, such as a lithographic method including a number of steps of deposition and patterning.

The thin film 5 is of a sufficient flexibility to expand such that probe 7 can move closer to and further from the area of upper space transformer 3. The thin film 5 can be of any suitable thickness, for example, from one or more nanometers to several micrometers in thickness. Thin film 5 can be formed of a polyimide, or any other suitably flexible material. Optionally, a release or adhesion seed layer can be placed on thin film 5 on the surface nearest the upper space transformer 3, or a release or adhesion seed layer can be placed on upper space transformer 3 on the surface nearest thin film 5.

Figure 4:
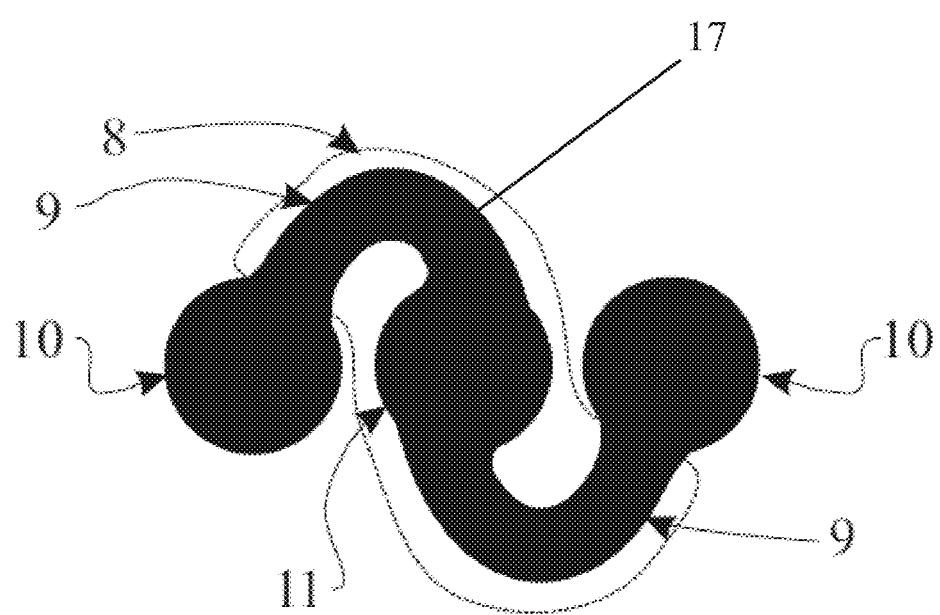
FIG. 4 is a top view of a metallization of the first embodiment.

The metallization 17 is configured to bend and provide compliance and will be shown in more detail below, with the thin film land 11 can include an adhesion/diffusion barrier between thin film 5 and the metallization 17. A top view of metallization 17 (black portions) shown in FIG. 4. Also shown in FIG. 4 is an area of a release mask 8 (the white area indicated by numeral 8 is the upper release mask).

Figure 5:
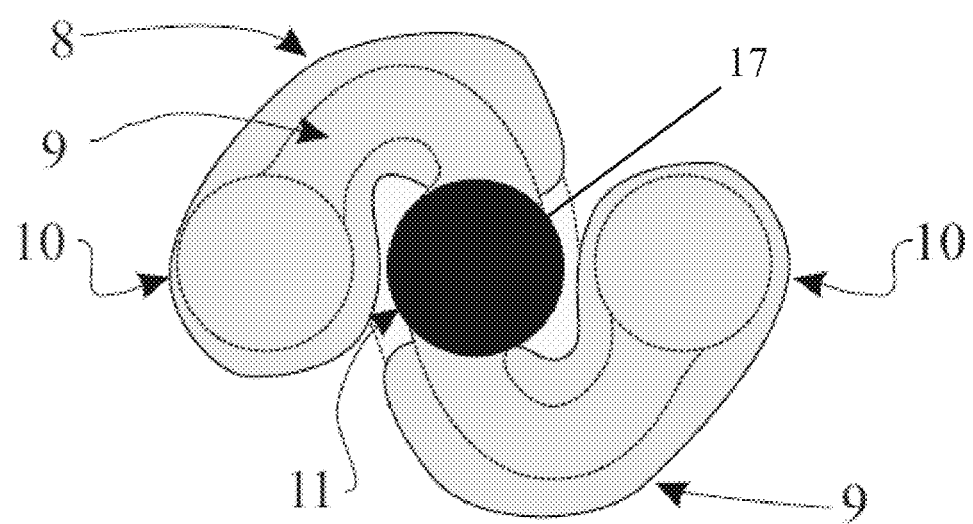
FIG. 5 is a top view of a metallization of the first embodiment.

As shown in FIG. 5, another top view of metallization 17 includes area of the release mask 9 (the white area indicated by numeral 8 is the upper release mask) (the gray area indicated by numeral 8 is the lower release mask). The release mask 8 can be other materials other than a mask, such as any other additional material that aids in a release of metallization 17 from thin film 5 and upper space transformer 3. Release mask 8 in other embodiments can be the lack of an adhesion layer.

The release mask 8 allows for metallization to vertically expand and contract as compressed air is delivered and withdrawn from pressurized gas region 12. Although the term "compressed air" is used herein as an example, that term can be any other gas or gases, or any other liquid or liquids under pressure.

Figure 6:
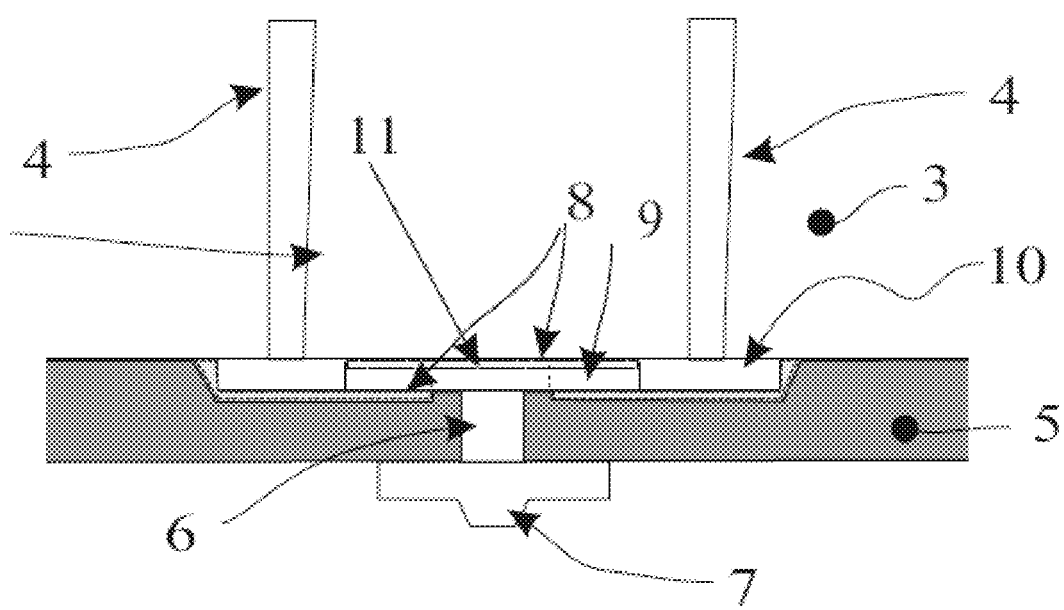
FIG. 6 is a side view of FIG. 3.

FIG. 6 is a side view of what is shown in FIG. 3 when the thin film 5 is an unexpanded state. In FIG. 3, thin film 5 is at least partially expanded.

Figure 7:
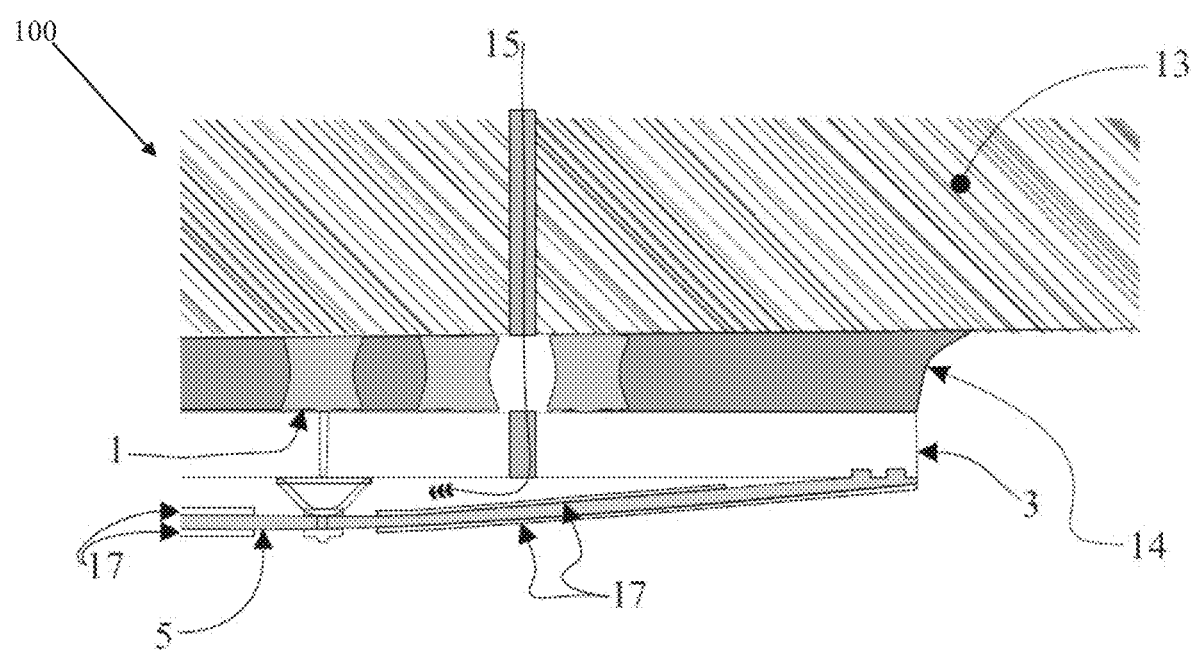
FIG. 7 is a magnified view of another portion of FIG. 2.

FIG. 7 is a magnified view of Detail B of FIG. 2 and illustrates one embodiment of how thin film 5 is secured to upper space transformer 3 (or other silica or glass material). In this embodiment, two ridges of the thin film 5 are secured to upper space transformer 3 with a suitable adhesive. In other embodiments, the structure and adhesive securing these elements together can be modified.

As can be seen in FIG. 7, gas and/or fluid inlet 15 allows for pressurized gas and/or fluid to enter into a space formed between thin film 5 and upper space transformer 3. Optional metal films 17 are shown as included in FIG. 7 as adhered to several portions of the thin film 5. In other embodiments fewer or more metal films 17 can be included. The metal films 17 are suitably adhered to thin film 5 and can act as a stiffener, making it less likely that thin film 5 will overexpand.

In this embodiment instead of a C4 bump of solder, a ring of C4 1 is formed such that a substantially hollow portion is formed within the ring. As shown in FIG. 7, gas and/or fluid inlet 15 passes through this substantially hollow portion.

Use of the die probe 100 shown in FIGS. 1-7 is now described. Initially, the die probe 100 is aligned (X, Y, theta) to the chip contact array that is to be tested (not shown). Next, the die probe 100 is moved (Z direction) towards the chip contact array until contact is made between one or more probes 7 and the chip contact array. Next, the die probe 100 is overdriven in the Z direction towards the chip contact array, which aids in each probe 7 making contact. The Z axis is then fixed.

Upon fixation of the Z axis, pressurized gas and/or fluid is delivered to the pressurized gas region 12 such that thin film 5 expands and probe 7 moves further downward in the Z direction. This further movement of probe 7 can be about 3-5 microns, or more. Optionally, during delivery of pressurized gas and/or fluid to the pressurized gas region 12, oscillations can also be provided to the thin film 5 to promote scrubbing of probe 7.

The contact array of the wafer or die being tested is then suitably tested. After the test(s) is complete, the pressurized gas and/or fluid is removed from pressurized gas region 12 and thin film 5 contracts. Then, die probe 100 is moved in an opposite direction as the overdriven Z direction. Lastly, die probe 100 is moved away from contact with the tested wafer or die contact array. Optionally, during removal of the pressurized gas and/or fluid from the pressurized gas region 12, oscillations can also be provided to thin film 5 to reduce the sticking of probe 7 to the contact array.

Figure 8:
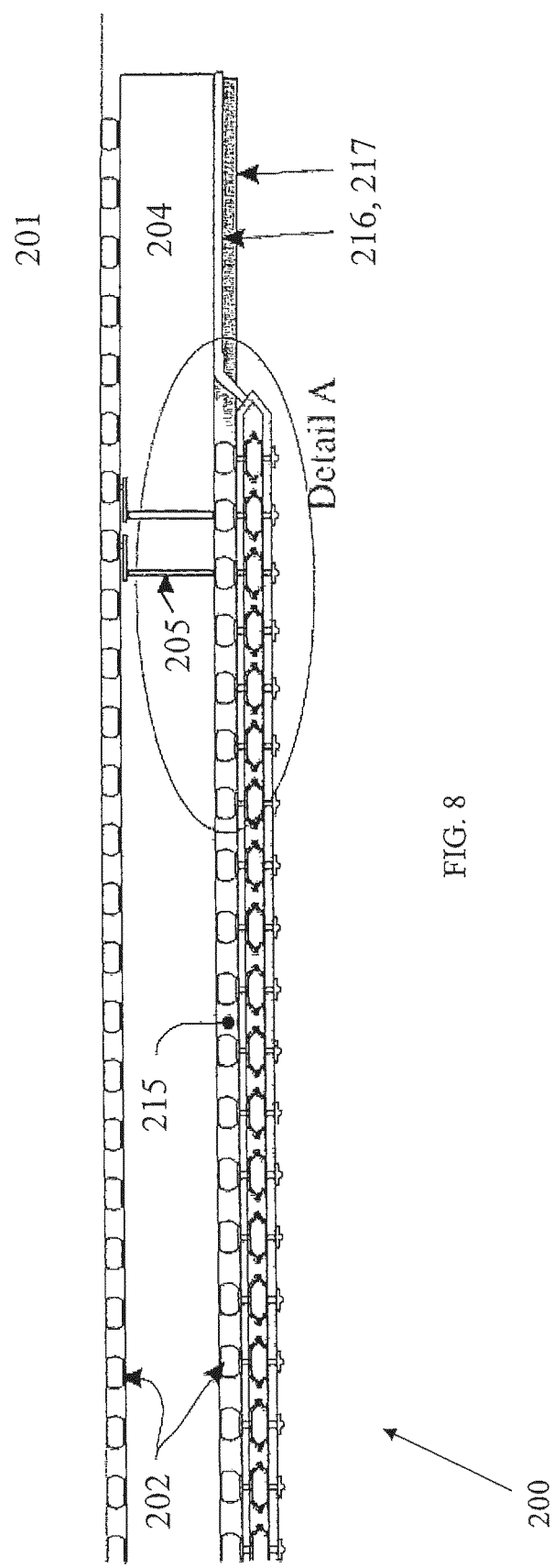
FIG. 8 is a cross sectional view of a die probe of the second embodiment.

Another embodiment of the present disclosure is shown in FIG. 8, a die probe 200 is similar to the first embodiment shown in FIG. 2 in several respects. FIG. 8 is a side view of a probe array with two layers of thin film. In this embodiment two portions of C4 bumps 202 are present between redistribution substrate 201 and thin films 6. Connecting the two portions of C4 bumps 202 are silicon through vias 205 through a portion of silicon 204. The vertically lower C4 bumps 202 are within an underfill 215, which separates the elements from a gas and/or fluid inlet 216 and an overmold (upper overmold) 217. In this embodiment the thin films 6 can be formed independently from the C4 bumps 202 and the redistribution substrate 201 and the thin films 6 can be transferred to their position shown in FIG. 8. The thin films 6 and underfill 215 can then be joined together by any suitable method, including application of an adhesive between them.

In FIG. 8 the vertically upper row of C4 bumps 202 and redistribution substrate 404 are optional, with the vertically lower row of C4 bumps 202 being capable of attaching to an array directly.

Figure 9:
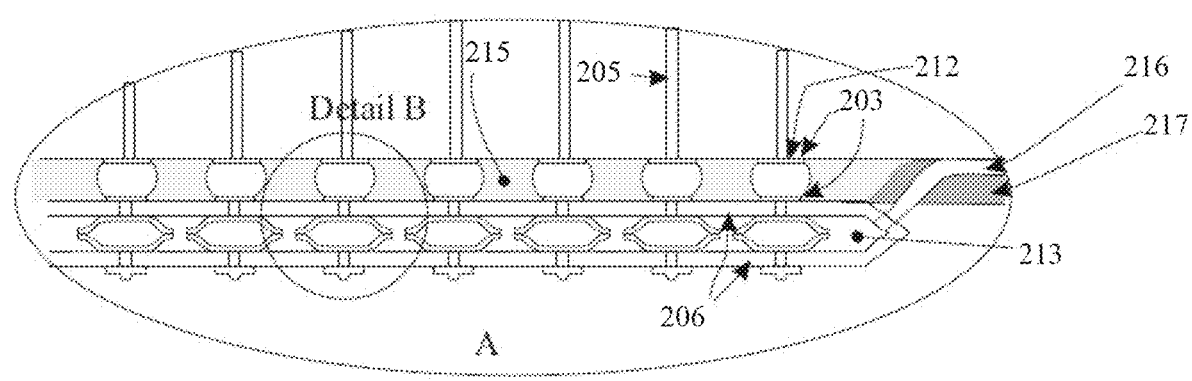
FIG. 9 is a magnified view of a portion of FIG. 8.

A detailed portion of FIG. 8, "Detail A" is shown in FIG. 9. In FIG. 9 a pressurized gas and/or fluid inlet 216 passes through overmold 17 and allows for pressurized gas and/or fluid to enter into a space 213 formed between thin films 206. Also shown in FIG. 9 are C4 capture pads 203 and a thin film land 212 for each of the C4 bumps 202, which sufficiently connect the silicon through vias 205 with the C4 bumps 202.

In other embodiments of FIG. 9, instead of a pressurized gas and/or fluid inlet 216 entering one side of the thin films 206, pressurized gas and/or fluid can enter in a similar fashion as shown in FIG. 7, which is through one or more ring shaped C4 solder bumps.

Figure 10:
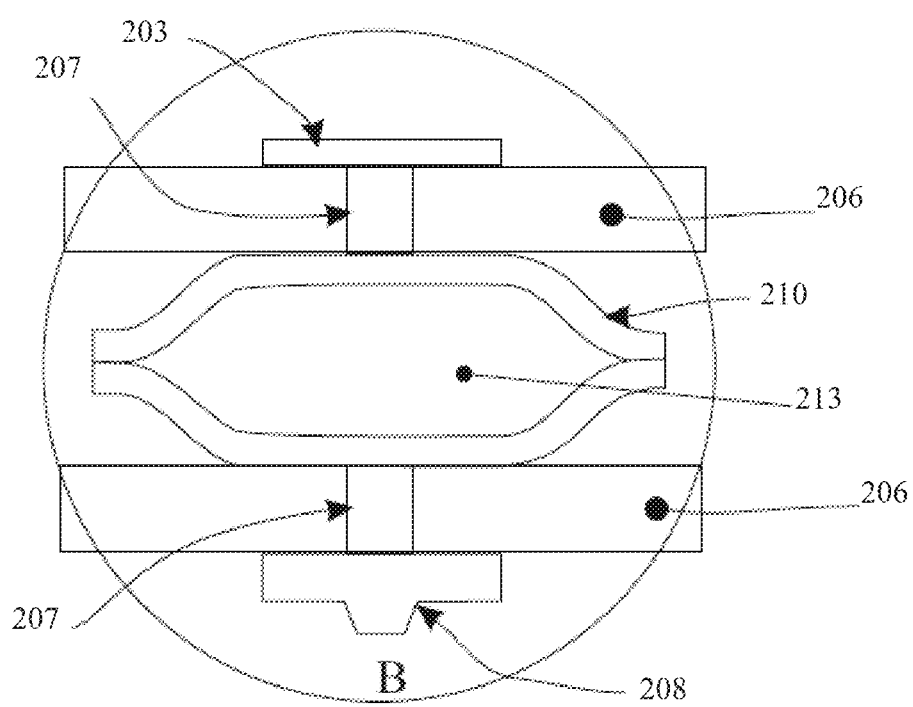
FIG. 10 is a magnified view of a portion of FIG. 9.

A detailed portion of FIG. 9, "Detail B" is shown in FIG. 10. Connecting the (C4) upper capture pad 203 to the metallization 210 is a thin film through via 207, which passes through one thin film 206, and also through the second thin film 206 to contact the probe 208. Metallization 210 is configured to allow the metal traces to be able to expand or bend and is shown in an expanded state in FIG. 10. Once expanded inelastically the expanded metal will have some associated spring force. The total contacting force will be the sum of the probe spring force and the force provided by the pressurized thin film membrane. The total force is dominated by the force of the pressurized thin film membrane Metallization 210 is expanded because 9 pressurized gas and/or fluid has entered space 213, causing thin films 206 to move away from each other. The total distance the films can expand is limited by the array being contacted. Metallization 210 can include two pieces of a metal trace that are placed opposite each other, such as one of the two metallizations 210 being similar to that shown in FIG. 4, with the opposing metallization 210 also being similar to that shown in FIG. 4 rotated about 180°. In still other embodiments, metallizations 210 can be any other suitable structure than can be formed in a manner having 'unattached' areas of metal trace allowing deforrnation of the metal films by expansion of the space in-between two thin films 206 or between a through silicon via (TSV) substrate and thin film (FIG. 3 reference numbers 3 and 5).

Figure 11:
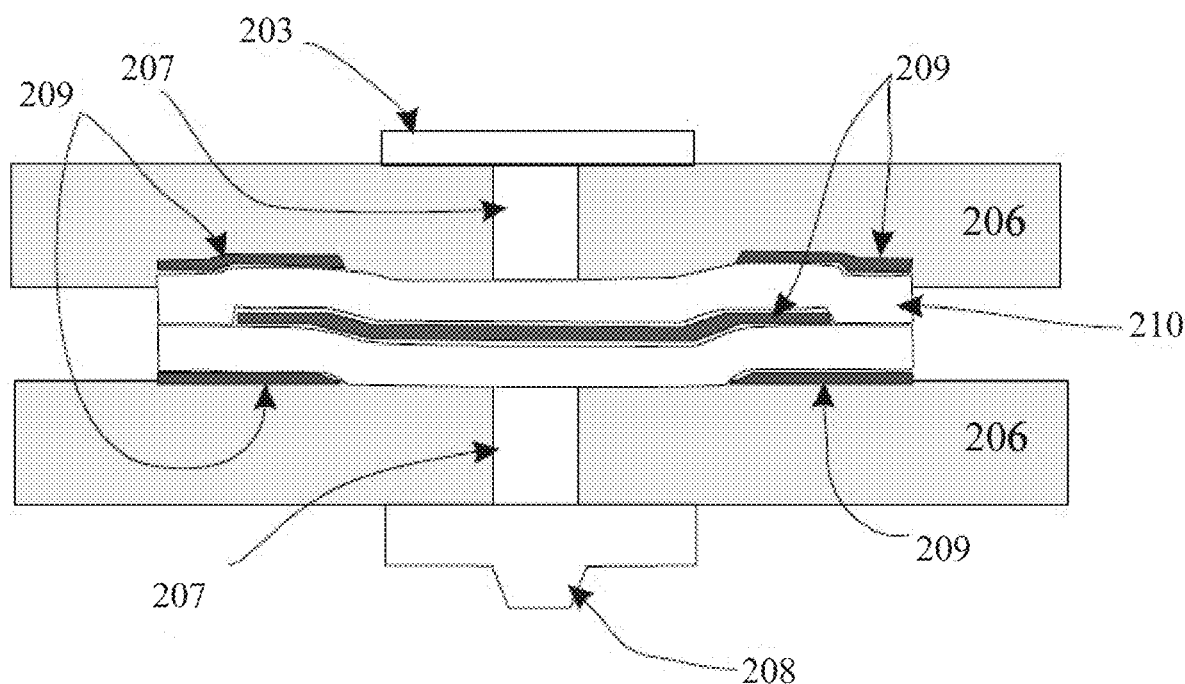
FIG. 11 is a magnified view of a portion of FIG. 9.

FIG. 11 is a side view of a contracted metallization 210, such that thin films 206 are unexpanded. Recompression of the expanded metal thin films by evacuating the pressurized gas or liquid will bring the metal traces closer to their original unexpanded position as in FIG. 10. In this configuration substantially all of the pressurized gas and/or fluid has exited space 213. Optionally, several areas of the metallization 210 can include release mask surfaces 209. The release mask surfaces 209 can be other materials other than a mask, such as any other additional material that aids in a release of a compressed metallization 210 from thin films 206 and from other surfaces of metallization 210. Optionally, release mask surfaces 209 in other embodiments can be the lack of an adhesion layer.

Figure 12:
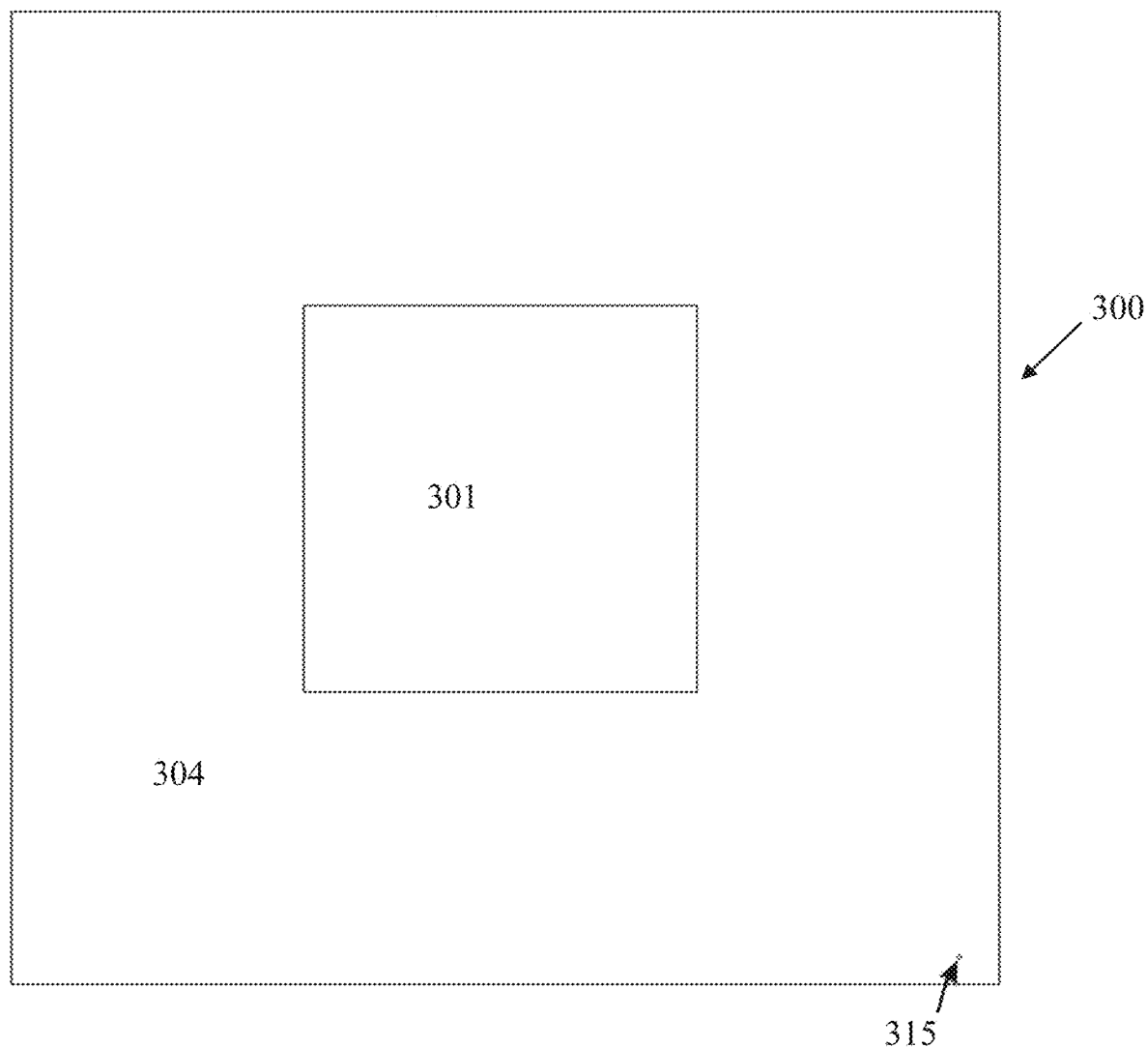
FIG. 12 is a top view of a die of the third embodiment.

In another embodiment a top view of a die package 300 is shown in FIG. 12. In FIG. 12, a top view of a die 301, a silicon and/or ceramic space transformer (upper space transformer) 304 and a liquid and/or gas inlet 315 is shown. In this embodiment upper space transformer 304 can be a glass or a ceramic. A side view of FIG. 12 is shown in FIG. 13.

Figure 13:
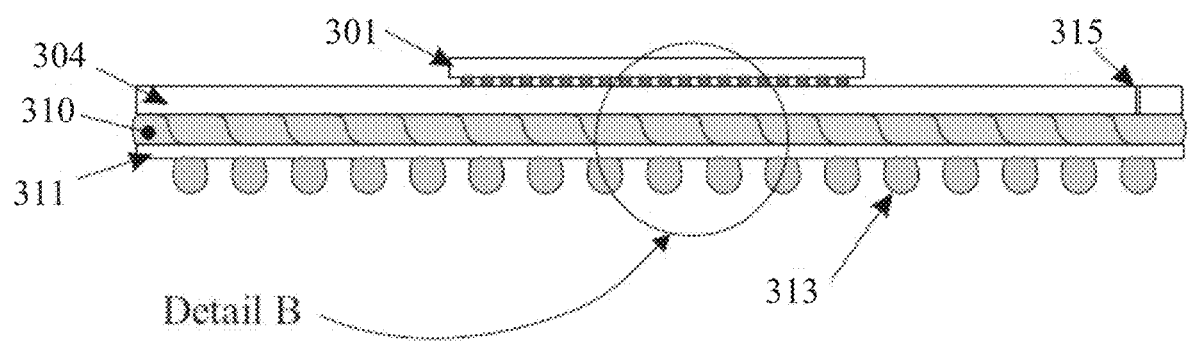
FIG. 13 is a side view of the die of FIG. 12.

FIG. 13 also includes die 301, a silicon and/or ceramic upper space transformer 304 and a liquid and/or gas inlet 315, and also a pressurized liquid and/or gas region 310 that is configured to accept liquid and/or gas from the liquid and/or gas inlet 315. Space transformer (lower space transformer) 311 is separated from upper space transformer 304 by the pressurized liquid and/or gas region 310 and includes several balls of a ball grid array 313. A further more detailed view of the die package 300 is shown "Detail B" of FIG. 13, and is shown in FIG. 14.

Figure 14:
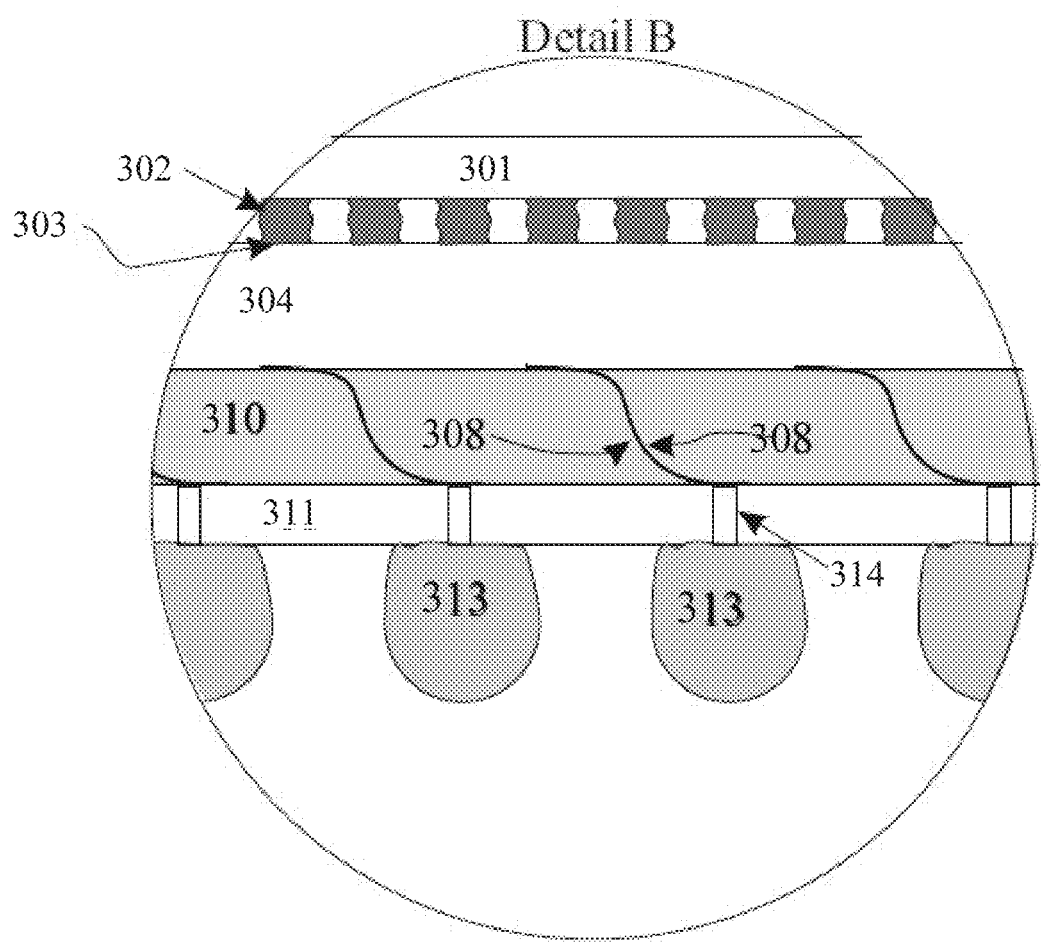
FIG. 14 is a magnified view of a portion of FIG. 13.

FIG. 14 provides a more detailed view of the structure. As can be seen, die 301 is connected to upper space transformer 304 by a number of C4 302, which themselves are separated from upper space transformer 304 by a capture pad 303. Included within the pressurized liquid and/or gas region 310 are a plurality of metal traces 8, which are connected on one end to upper space transformer 304, and on the other end to lower space transformer 311. These metal traces 8 operate in a similar way as the metallization 17 of FIG. 3.

Returning again to FIG. 14, a lower via 314 connects metal trace 308 with the balls of the ball grid array 313 through the lower space transformer 311. As shown in FIG. 14, the structure is in an expanded state since the pressurized gas region 310 has received a pressurized liquid and/or gas from liquid and/or gas inlet 315 (shown in FIG. 13).

Figure 15:
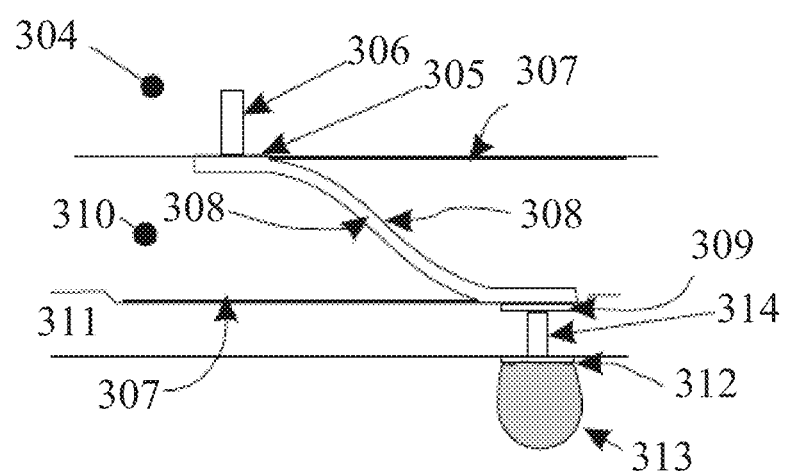
FIG. 15 is a magnified view of a portion of FIG. 14.

FIG. 15 is a more magnified view of FIG. 14, still showing the structure in an expanded state with the pressurized gas region 310 having received a pressurized liquid and/or gas from liquid and/or gas inlet 315 (shown in FIG. 13). In this figure, lower space transformer 311 (which can be an organic material) decouples, from upper space transformer 304, which can be substantially matched to a coefficient of thermal expansion of silicon die 301. A substantial match of the coefficient of thermal expansion between silicon die 301 and upper space transformer 304 aids in avoiding thermal stress/strain from a differential expansion of silicon die 301 and upper space transformer 304.

The ball of the ball grid array 313 is connected to the lower via 314 by lower capture pad 312, with the lower via 314 connecting to the metal trace 308 through bottom capture pad 309. Upper via 306 passes through upper space transformer 304, and is connected to upper pad 305, which is subsequently connected to metal trace 308.

To aid in release of metal trace 308 from both upper space transformer 304 and lower space transformer 311 when the structure is in a non-expanded state, a release mask 307 is present on both upper space transformer 304 and lower space transformer 311. The release mask 307 can be other materials other than a mask, such as any other additional material that aids in a release of the metal trace 308 from the upper space transformer 304 and lower space transformer 311. Release mask 307 in other embodiments can be the lack of an adhesion layer.

Figure 16:
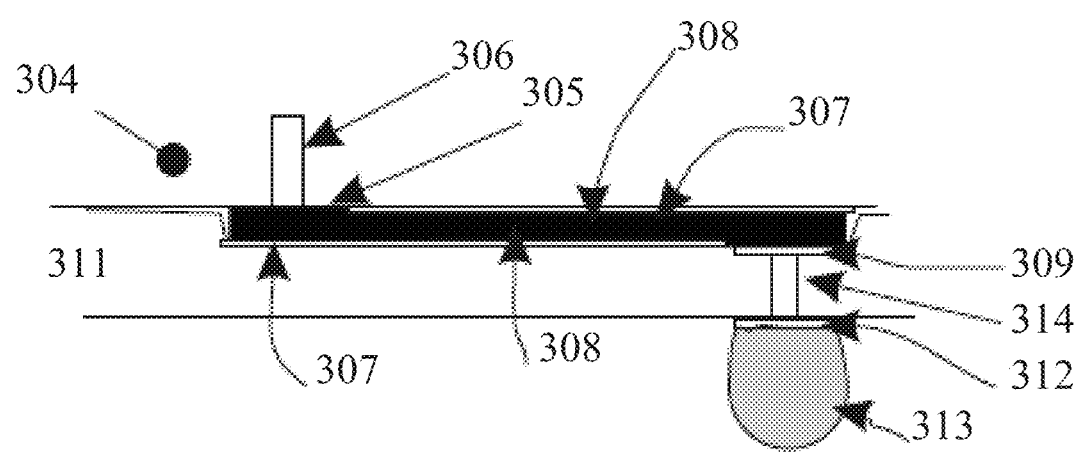
FIG. 16 is a magnified view of a portion of FIG. 14.

FIG. 16 illustrates the same portion of the structure as FIG. 15, but in a non-expanded state. In a non-expanded state substantially all of the pressurized liquid and/or gas has been either never added or has been removed from the pressurized gas region 310. In a non-expanded state upper space transformer 304 moves closer to lower space transformer 311, causing metal trace 308 to bend and contact release mask 307.

Figure 17:
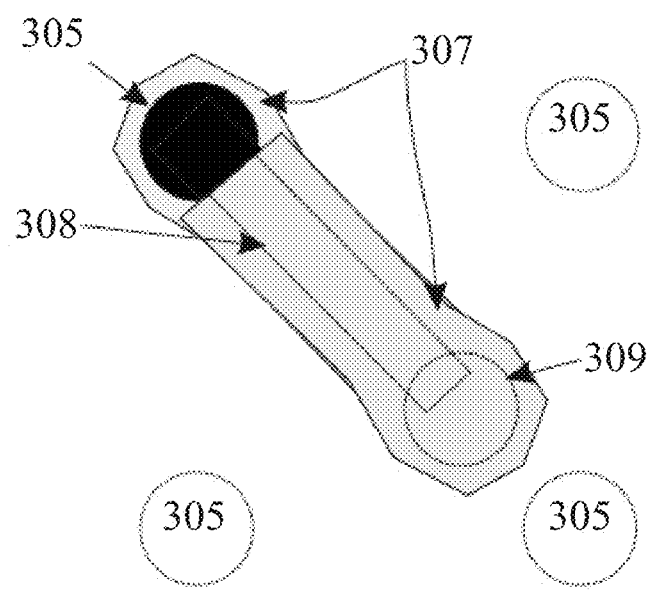
FIG. 17 is a top view of a portion of an upper space transformer and capture pads of the third embodiment.

FIG. 17 is a top view of four capture pads 305 that would be on the vertically lower surface of upper space transformer 304. One metal trace 308, one release mask 307 and one bottom capture pad 309 is shown for exemplary purposes, but in die package 300 for each capture pad 305, each capture pad 305 would also include metal trace 308, release mask 307 and bottom capture pad 309.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A die probe comprising:
a probe tip operably connected to a first surface of a thin film;
a metal trace comprising a first end, a second end and a middle portion between the first end and the second end, wherein the middle portion of the metal trace is operably connected to a second surface of the thin film, the second surface of the thin film opposite the first surface of the thin film;
an upper space transformer, wherein both the first end and the second end of the metal trace are in physical contact with a first surface of the upper space transformer, wherein a pressurized liquid and/or gas is configured to expand a space between the second surface of the thin film and the upper space transformer, wherein the metal trace is configured to vertically expand and vertically contract between an expanded state and an unexpanded state, and wherein the probe tip is configured to move closer to, and further from, the upper space transformer; and
a release layer of material on the first surface of the upper space transformer.

2. The die probe of claim 1, wherein the thin film is a polyimide.

3. The die probe of claim 1, wherein thin film is operably connected to the upper space transformer.

4. The die probe of claim 1, wherein the pressurized liquid and/or gas enters the space between the second surface of the thin film and the upper space transformer through an opening in the upper space transformer.

5. The die probe of claim 1, wherein the probe tip is electrically connected to the metal trace by a via.

6. The die probe of claim 5, wherein the via passes through the thin film.

7. The die probe of claim 5, further comprising a via land between the metal trace and the upper space transformer.

8. The die probe of claim 1, wherein the space between the second surface of the thin film and the upper space transformer expands up to about 5 microns.

9. The die probe of claim 1, wherein the metal trace is electrically connected to a solder bump by a silicon via.

10. The die probe of claim 9, wherein the silicon via passes through the upper space transformer.

11. The die probe of claim 1, further comprising a thin film land between the metal trace and the thin film.

12. The die probe of claim 1, further comprising a second release layer of material on the second surface of the thin film.

13. The die probe of claim 1, wherein, in the expanded state, the middle portion is nearer the probe tip than either of the first end or the second end.

14. The die probe of claim 1, wherein in the unexpanded state a distance between the upper space transformer and the second surface of the thin film is a thickness of the metal trace in a thickness direction, the thickness direction orthogonal to the thin film.

15. A die probe comprising:
a probe tip operably connected to a first surface of a thin film;
a metal trace comprising a first end, a second end and a middle portion between the first end and the second end, wherein the middle portion of the metal trace is operably connected to a second surface of the thin film, the second surface of the thin film opposite the first surface of the thin film;
an upper space transformer, wherein both the first end and the second end of the metal trace are operably connected to a first surface of the upper space transformer, wherein a pressurized liquid and/or gas is configured to expand a space between the second surface of the thin film and the upper space transformer, wherein the metal trace is configured to vertically expand and vertically contract between an expanded state and an unexpanded state, and wherein the probe tip is configured to move closer to, and further from, the upper space transformer, wherein, in the expanded state, the middle portion is nearer the probe tip than either of the first end or the second end; and a release layer of material on the first surface of the upper space transformer.

* * * * *